Feb. 28, 1967 H. F. STERLING ET AL 3,306,788

METHOD OF MASKING MAKING SEMI-CONDUCTOR AND ETCHING BENEATH MASK

Filed Jan. 27, 1964

INVENTORS.
HENLEY F. STERLING
BY CYRIL F. DRAKE
ATTORNEY

United States Patent Office 3,306,788

Patented Feb. 28, 1967

3,306,788

METHOD OF MASKING MAKING SEMICONDUCTOR AND ETCHING BENEATH MASK

Henley F. Sterling and Cyril F. Drake, Harlow, England, assignors to International Standard Electric Corporation, New York, N.Y., a corporation of Delaware Filed Jan. 27, 1964, Ser. No. 340,443
Claims priority, application Great Britain, Feb. 8, 1963, 5,232/63, 5,233/63
14 Claims. (Cl. 148—175)

Figures 1, 2, 3, 4, 5, 6:
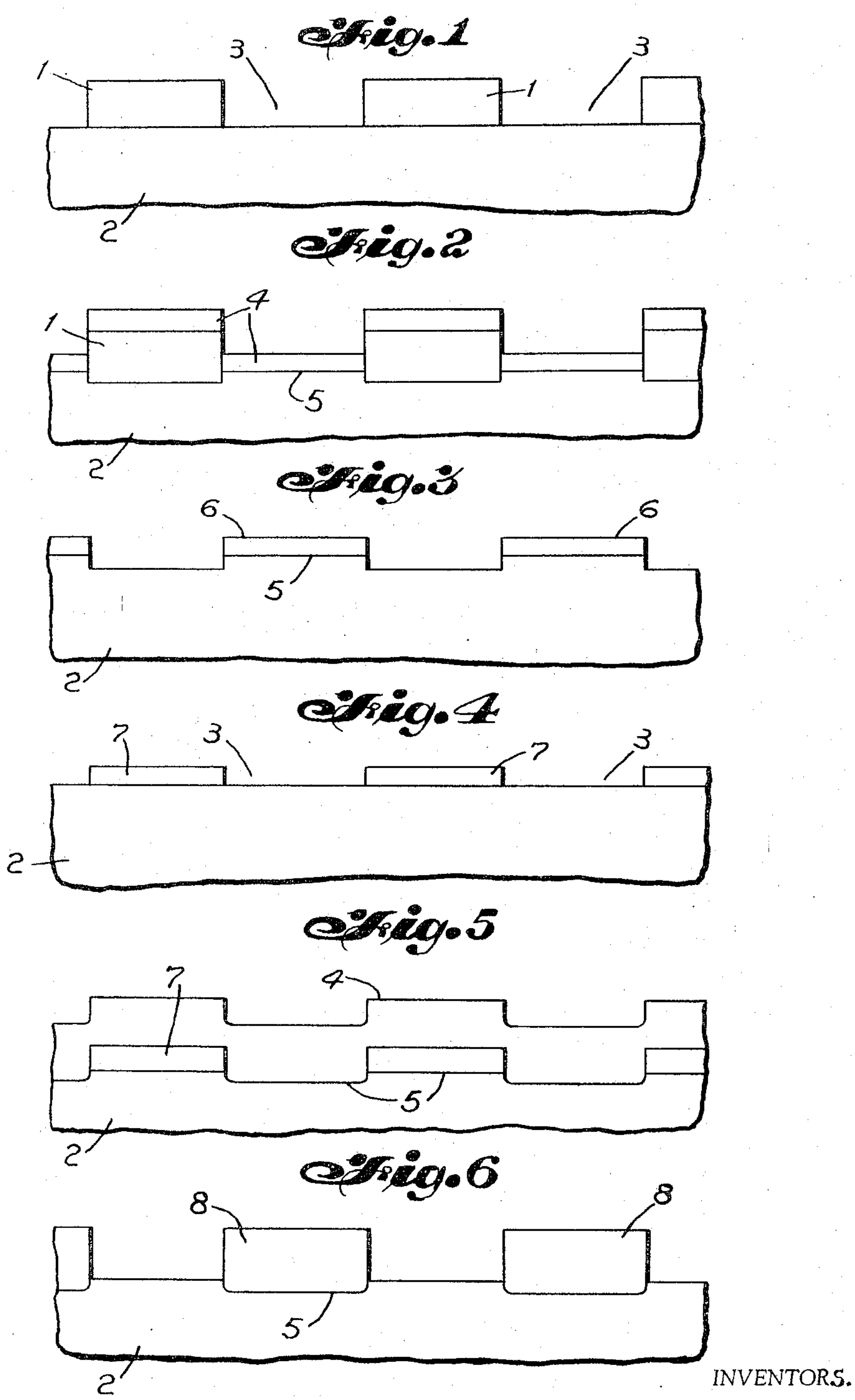

This invention relates to the manufacture of semiconductor devices.

In vapor phase deposition processes associated with the production of semiconductor layers on semiconductor substrates it is often necessary to provide a system whereby discrete areas of semiconductor are built up, each containing the necessary system of layers appropriate to one circuit element. In order to achieve this, some form of masking is necessary.

According to the invention there is provided a method of manufacturing a semiconductor device which includes placing a mask of suitable material on to a substrate of semiconductor material and placing another semiconductor layer thereover during a stage of vapor phase deposition that semiconductor material beneath the masked areas is etched away. In another form of the invention, the mask deposited on a substrate surface is of a metal capable of conversion to a volatile oxide. Semiconductor material is deposited on the mask and the exposed surface areas, with the mask converting to the oxide to form the desired pattern.

Embodiments of the invention will now be described with reference to the accompanying drawings, in which FIGS. 1 to 3 show successive stages in one form of manufacture of mesa-type diodes each containing a P–N junction, and FIGS. 4 to 6 show successive stages in another form of the invention.

Referring to FIGS. 1 and 2, a mask of molybdenum is placed on the surface of a substrate 2 of silicon of one conductivity type. Apertures 3 in the mask 1 define discrete areas in which the individual mesas are to be formed.

The vapor phase deposition of a layer of silicon of opposite conductivity type is then carried out using the chemical reduction of silicon tetrachloride or other suitable halogen compound, and a silicon layer 4 is deposited on the substrate 2 in the areas defined by the mask, and also over the mask 1.

By virtue of chemical reactions occurring intimately between the under side of the mask 1 and the silicon in the complex atmosphere present during the vapor phase deposition, etching of the surface of the silicon on which the mask 1 rests, occurs, with the result that when the mask is removed after the deposition, P–N junctions 5 formed by the deposition process are contained within individual mesas 6 (FIG. 3) defined by the previously unmasked areas which now stand protuberant of the remaining etched surface of the substrate 2.

If desired, later treatment in an oxidizing atmosphere, or silicon deposition from the vapor phase, results in the formation of an oxide layer which protects the exposed edges of the P–N junctions.

During this etch masking process it has been found that the surface finish of the mask plays some part in deciding the type of gas etching which takes place. For instance, fine scratches on the mask surface result in the production of relatively deep furrows in the adjacent etched silicon surface. The effect can be made use of in delineating areas or to provide lines of easy fracture.

Other materials which can be used for the mask are tantalum, niobium, chromium, vanadium or tungsten which are metals in groups VA or VIA of the Periodic Table.

By way of a specific example, the mask 1 is formed by an area of molybedenum sheet 0.1 mm. thick and 1 cm. square having a number of holes 2 mm dia. drilled through it. The mask is heat treated in hydrogen gas at 1300° C. and after cooling has its surface abraded by coarse Carborundum powder.

In an apparatus designed for the epitaxial deposition of silicon by the hydrogen reduction of a halogen compound of silicon, the mask of molybdenum is placed over and in contact with the substrate 2. The substrate in this example is a slice of single crystal silicon 1 cm. diameter and of chosen P-type conductivity. It is prepared by mechanical and/or chemical polishing and cleaning as known in the art for epitaxial growth.

Hydrogen gas is purified by diffusion through a palladium silver alloy membrane heater to 300° C. and bubbled through silicon tetrachloride refrigerated to −30° C. The silicon tetrachloride contains a minute measured amount of phosphorous trichloride to deposit the desired resistivity of N-type silicon. This gas mixture is led into the reaction tube which is 2.5 cm. diameter and impinges onto the masked silicon assembly which is induction heated by means of a graphite susceptor to a temperature of 1250° C.

In this way silicon of N-type is deposited through the holes in the mask on to silicon of P-type conductivity. Deposition is local and in single crystal form. Etching takes place under the mask so that the areas of growth are sharply defined.

On cooling and removal from the apparatus the silicon surface reveals a number of raised plateaus coinciding with the holes in the mask. Without further treatment of any kind, the discrete elements so produced show the typical rectifying electrical characterization of discrete elements of silicon dictated by the particular P–N junction formation expected.

As shown in FIG. 4, wherein similar elements are designated by the same members as in the previous figure, a layer 7 of a metal capable of conversion to a volatile oxide such as molybdenum, tungsten or vanadium is deposited on a substrate 2, for example of silicon, by any known method e.g. by electrodeposition or from the vapor phase. This layer is deposited in the form of a grid or pattern to define discrete unmasked areas 3, or may be etched to form this type of configuration after deposition. In this way areas of substrate which are separated from each other (as islands) can be subjected to conditions of vapor phase deposition by which process semiconductor material 4 is then deposited over the complete surface including the metallized area as shown in FIG. 5, with the result that electrical elements of the correct predetermined design are formed in the exposed areas of the semiconductor surface and below it. For example, if the substrate is of N-type silicon and the deposited semiconductor material is P-type silicon, then P–N junctions 5 will be formed below the surface of the substrate 1 due to diffusion. It will be clear that in general the semiconductor deposited on the semiconducting substrate will be adherent, whilst the semiconductor deposited on the metal will be multicrystalline and less coherent.

It is necessary now to heat treat the composite body so far produced in an oxidizing atmosphere so that the molybdenum is converted to a volatile oxide which evaporates. Any semi-conducting material laid down on the metal surface is released because the metal bond between it and the substrate is destroyed by this oxidation and volatilization. The resulting discrete elements 8 (FIG. 6) can then be separated by cutting.

The particular embodiments described are not to be construed as limiting the novel concept, as many other variations may be made within the scope of the invention as defined in the appended claims.

What is claimed is:

1. A method of manufacturing discrete areas of semiconductor material on a surface of a substrate, which includes the steps of depositing on said surface a mask of a metal capable of conversion to a volatile oxide to define the said areas, depositing semiconductor material on the exposed surface and the mask, and causing the mask to be converted to its volatile oxide.

2. A method as claimed in claim 1 in which said mask is converted to its volatile oxide by heating in an oxidizing atmosphere.

3. A method as claimed in claim 2 in which said metal is selected from the group comprising molybdenum, tungsten and vanadium.

4. A method as claimed in claim 3 in which said substrate is of semiconductor material.

5. A method of manufacturing discrete areas of silicon semiconductor material of one conductivity type on a surface of a silicon semiconductor substrate of the opposite conductivity type, which includes the steps of depositing on said surface a mask of a metal selected from the group comprising molybdenum, tungsten and vanadium to define the said areas, depositing the semiconductor material of said one conductivity type on the exposed surface and the mask, and heating the substrate in an oxidizing atmosphere to convert the mask to its volatile oxide.

6. A method of manufacturing silicon semiconductor elements, which comprises depositing a mask of a metal selected from the group consisting of molybdenum, tungsten and vanadium on a surface of a silicon semiconductor substrate of one conductivity type, which mask defines by its interstices the elements to be manufactured, depositing on the exposed silicon surface and on the surface of said mask silicon semiconductor material of the opposite conductivity type to said substrate, so that P–N junctions are produced at the exposed areas of said silicon substrate, heating said substrate in an oxidizing atmosphere to convert the mask to its volatile oxide, thus removing said mask and the semiconductor material thereupon and cutting said substrate so as to separate the individual elements each of which includes one of said P–N junctions.

7. A process for manufacturing a semiconductor device, including the steps of:

placing an apertured mask on a major surface of a silicon semiconductor wafer of one conductivity type, the interface between said mask and said major surface being penetrable by a gaseous silicon etchant;

epitaxially depositing silicon of opposite conductivity type on said major surface through said aperture by the vapor phase reaction of hydrogen with a halogen compound of silicon, said reaction simultaneously producing a volatile hydrogen halide capable of etching silicon, whereby during said deposition step said hydrogen halide penetrates said interface to etch the portion of said major surface beneath said mask; and removing said mask from said surface.

8. The process of claim 7 wherein said mask comprises a material capable of conversion to a volatile oxide, and said removing step comprises heat treating the mask and semiconductor material in an oxidizing atmosphere to convert said mask to said volatile oxide which evaporates thereby removing said mask material from said major surface.

9. A process according to claim 7, wherein said halogen compound is silicon tetrachloride.

10. A process according to claim 7, wherein the surface of said mask contiguous with said interface is abraded prior to said placing step.

11. A process according to claim 8, wherein said mask material is selected from the group consisting of molybdenum, tungsten and vanadium.

12. A method of manufacturing a semiconductor device including vapor phase depositing silicon of one conductivity type on to the surface of a body of silicon of opposite conductivity type by the hydrogen reduction of a halogen compound of silicon, placing on said surface before said deposition a mask selected from the group consisting of molybdenum, tantalum, niobium, chromium, vanadium and tungsten having apertures therein to define the areas of deposition on said surface, the surface of the mask in contact with the surface of said body being so prepared as to permit the entry between the two surfaces of the atmosphere present during the vapor phase deposition such that in the presence of said atmosphere between said two surfaces the surface of the said body is etched away during said vapor phase deposition so that the level of the surface of said body covered by said mask falls together with the mask while the level of the surface of said body not covered by said mask rises due to the deposition thereon of said one conductivity type silicon.

13. A process for manufacturing a semiconductor device, comprising the steps of:

placing on a major surface of a silicon semiconductor wafer of one conductivity type an apertured mask comprising an oxidizable material selected from the group consisting of molybdenum, tantalum, niobium, chromium, vanadium and tungsten;

epitaxially depositing a silicon layer of opposite conductivity type on the exposed portions of said major surface by the vapor phase reaction of silicon tetrachloride and hydrogen, said reaction simultaneously depositing semiconductor material on top of said mask; and removing said mask by oxidizing said masking material and volatilizing the formed oxide, thus removing any semiconductor material overlying the original masking material.

14. A process according to claim 7, wherein said mask comprises a material selected from the group consisting of molybdenum, tantalum, niobium, chromium, vanadium and tungsten.

References Cited by the Examiner

UNITED STATES PATENTS

| | | | |
|---|---|---|---|
| 3,080,841 | 3/1963 | Nobel | 148—179 X |
| 3,140,965 | 7/1964 | Reuschel | 148—175 |
| 3,210,225 | 10/1965 | Brixey | 148—187 |
| 3,243,323 | 3/1966 | Corrigan | 117—200 |

HYLAND BIZOT, *Primary Examiner.*